US012727113B2

(12) United States Patent
Khalili et al.

(10) Patent No.: US 12,727,113 B2
(45) Date of Patent: Sep. 1, 2026

(54) HOTSPOT MITIGATION IN COMPUTING EQUIPMENT USING ENHANCED AIR MIXING

(71) Applicant: Google LLC, Mountain View, CA (US)

(72) Inventors: Sadegh Khalili, Santa Clara, CA (US); Madhusudan K. Iyengar, Foster City, CA (US); Weihua Tang, San Jose, CA (US)

(73) Assignee: Google LLC, Mountain View, CA (US)

( * ) Notice: Subject to any disclaimer, the term of this patent is extended or adjusted under 35 U.S.C. 154(b) by 243 days.

(21) Appl. No.: 18/614,058

(22) Filed: Mar. 22, 2024

(65) Prior Publication Data

US 2025/0301596 A1 Sep. 25, 2025

(51) Int. Cl.
*H05K 7/20* (2006.01)

(52) U.S. Cl.
CPC ..... *H05K 7/20145* (2013.01); *H05K 7/20727* (2013.01)

(58) Field of Classification Search
CPC ........... H05K 7/20145; H05K 7/20727; H05K 7/20136; H05K 7/20263; G06F 1/20; B01F 25/3131; B01F 25/42; B01F 25/4233; B01F 25/4311; B01F 25/4316; B01F 25/43161; F28F 2215/04; F01N 2240/20; F28D 5/00
See application file for complete search history.

(56) References Cited

U.S. PATENT DOCUMENTS

| | | | | |
|---|---|---|---|---|
| 5,058,837 | A * | 10/1991 | Wheeler | B64C 23/06 244/200.1 |
| 5,915,463 | A * | 6/1999 | Romero | H05K 7/20909 174/16.3 |
| 6,980,435 | B2 * | 12/2005 | Shum | H05K 7/20581 361/691 |
| 7,167,363 | B1 * | 1/2007 | Cushman | H05K 7/20145 361/692 |
| 7,787,247 | B2 * | 8/2010 | Han | H01L 23/467 174/15.1 |
| 7,961,462 | B2 | 6/2011 | Hernon | |
| 9,549,457 | B2 | 1/2017 | Ellis et al. | |
| 10,555,441 | B2 * | 2/2020 | Liang | H05K 7/20145 |
| 11,294,433 | B2 * | 4/2022 | Chen | G06F 1/185 |
| 11,659,694 | B2 | 5/2023 | Bryan et al. | |
| 2005/0259392 | A1 * | 11/2005 | Vinson | G06F 1/20 361/679.47 |

(Continued)

OTHER PUBLICATIONS

Extended European Search Report for European Patent Application No. 25165230.1 dated Sep. 8, 2025. 11 pages.

(Continued)

*Primary Examiner* — Michael A Matey
(74) *Attorney, Agent, or Firm* — Lerner David LLP

(57) ABSTRACT

A system includes an air mixer arranged between a heat source and at least one location downstream from the heat source. A plurality of airstreams flow in a direction from the heat source towards the at least one location. The air mixer is configured to mix surrounding airstreams of the plurality of airstreams at a first temperature with airstreams of the plurality of airstreams at a temperature higher than the first temperature to result in an overall lower temperature at the at least one location.

18 Claims, 15 Drawing Sheets

(56) References Cited

U.S. PATENT DOCUMENTS

| | | | | |
|---|---|---|---|---|
| 2005/0259393 | A1* | 11/2005 | Vinson | G06F 1/20 165/80.3 |
| 2006/0120043 | A1* | 6/2006 | Wolford | H05K 1/0272 361/695 |
| 2010/0302730 | A1* | 12/2010 | Hernon | H05K 7/20145 165/185 |
| 2012/0033379 | A1* | 2/2012 | Lam | H05K 7/20572 361/695 |
| 2014/0334093 | A1* | 11/2014 | Wei | H05K 7/20727 138/46 |
| 2015/0230327 | A1 | 8/2015 | Ellis et al. | |
| 2017/0273220 | A1* | 9/2017 | Nagasaka | H05K 7/20727 |
| 2018/0054923 | A1* | 2/2018 | Bryan | G06F 1/20 |
| 2020/0123955 | A1* | 4/2020 | Liu | B01F 25/31425 |
| 2021/0100137 | A1* | 4/2021 | Harrington | H05K 7/20781 |
| 2023/0189482 | A1* | 6/2023 | Rivaud | H05K 7/20727 361/679.47 |
| 2024/0130072 | A1* | 4/2024 | Andersen | H05K 7/20145 |

OTHER PUBLICATIONS

Thianpong et al. Numerical heat transfer study of square duct equipped with novel flapped V-baffles. International Journal of Thermal Sciences, Editions Elsevier, Paris, FR, vol. 197, Dec. 7, 2023 (Dec. 7, 2023), 14 pages. DOI: 10.1016/J.IJTHERMALSCI.2023.108819.

* cited by examiner

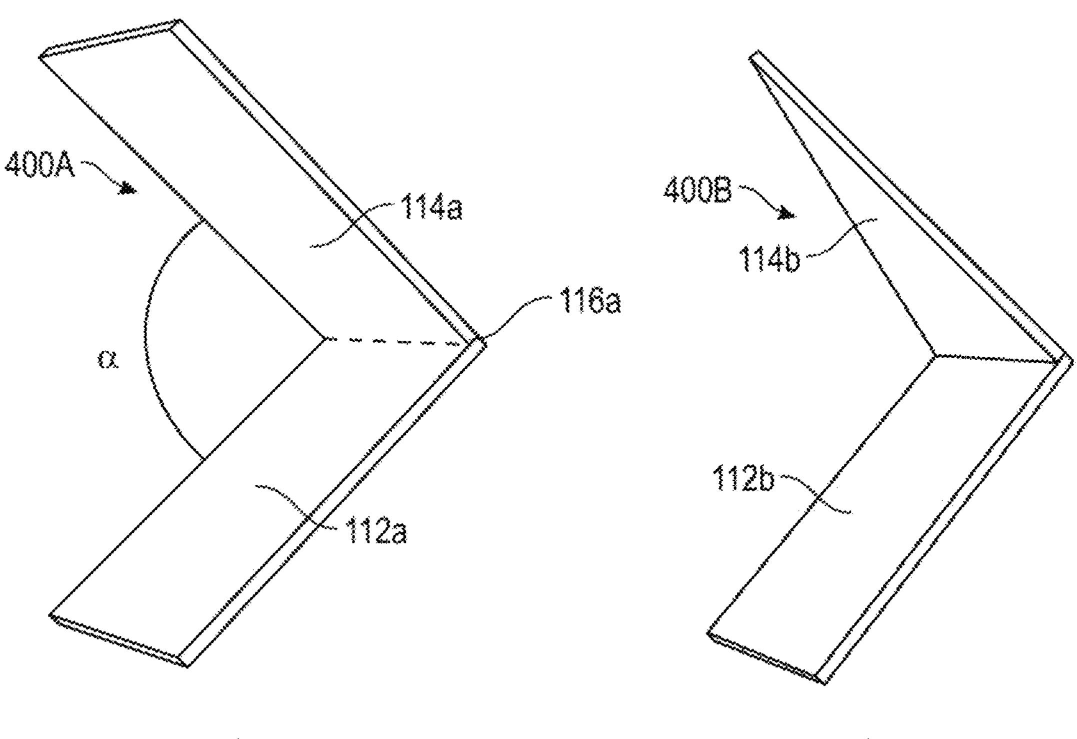
FIG. 4A
FIG. 4B
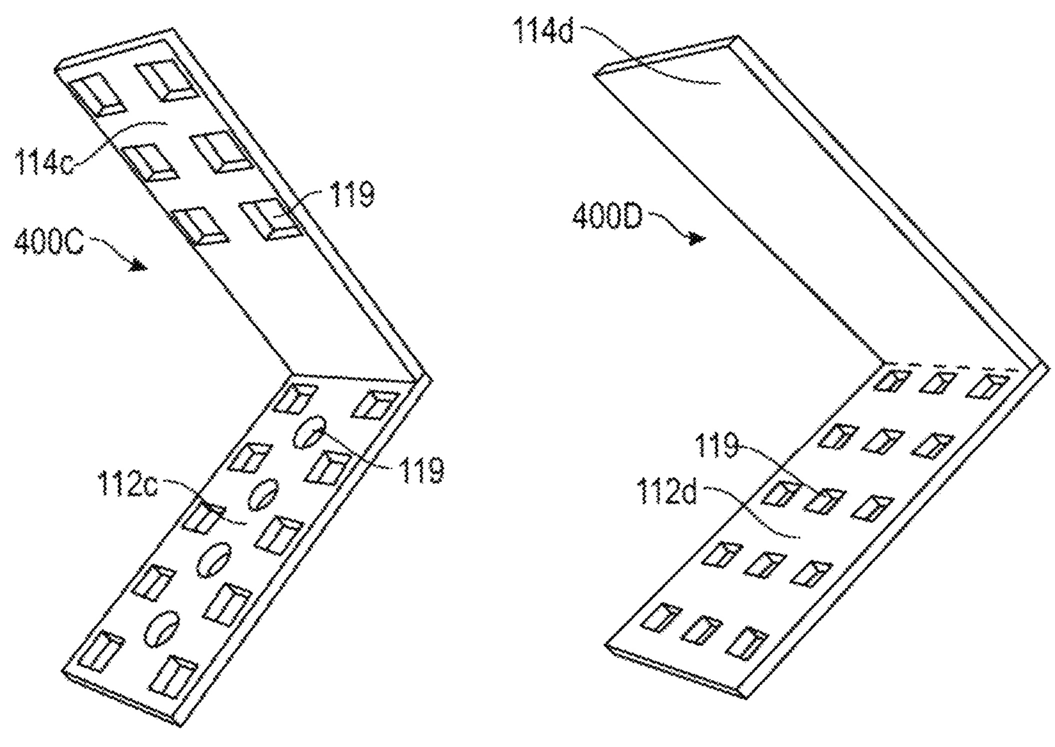
FIG. 4C
FIG. 4D

HOTSPOT MITIGATION IN COMPUTING EQUIPMENT USING ENHANCED AIR MIXING

BACKGROUND

Components of computing equipment generate heat during operation. When components of computing equipment exceed intended operating temperatures, problems may occur. For instance, the components may fail or not operate as intended. To prevent the components from exceeding the intended operating temperatures, a cooling medium such as air may be directed past the components in an effort to pull heat away from the components. However, as heat is pulled away from the components, the temperature of the air increases. In instances where an airflow is directed past more than one heated component, the temperature of the air may increase as it passes each heated component, thereby reducing the effectiveness of the airflow in reducing the temperature of the components positioned downstream from the heated component or components the airflow first passes. This may translate to higher temperatures of downstream components that are exposed to preheated airflow from upstream components.

BRIEF SUMMARY

According to an aspect of this disclosure, a system includes an air mixer arranged between a heat source and at least one location downstream from the heat source. A plurality of airstreams flow in a direction from the heat source towards the at least one location. The air mixer is configured to mix surrounding airstreams of the plurality of airstreams at a first temperature with airstreams of the plurality of airstreams at a temperature higher than the first temperature to result in an overall lower temperature at the at least one location.

In one example, the air mixer comprises a first diverter plate and a second diverter plate. The first diverter plate and the second diverter plate are arranged at an angle relative to one another.

In one example, a shape of the first diverter plate is identical to a shape of the second diverter plate. For example, each of the first and second diverter plates is rectangular. In yet another example, each of the first and second diverter plates is conical.

In another example, at least one of the first and second diverter plates is triangular.

According to one example, at least one of the first and second diverter plates comprises a plurality of flow-through apertures.

In one example, the system further includes a plate oriented perpendicular to a direction of the plurality of airstreams. In an example, the plate comprises a plurality of flow-through apertures. In another example, at least one of the first and second diverter plates comprises a plurality of flow-through apertures.

In yet another example, each of the first and second diverter plates is conical.

In another example, the system further includes a plate oriented perpendicular to a direction of the plurality of airstreams. In an example, the plate comprises a plurality of flow-through apertures.

In an example, the air mixer includes a passive propeller.

In another example, the air mixer includes an active device configured to generate airflow.

In one example, the air mixer comprises a hollow body and a phase change material encompassed within the hollow body.

According to an aspect, a method for mitigating a hotspot in a computing equipment includes directing a plurality of airstreams at a first temperature into an intake of a chassis housing a plurality of hardware components, a heat source arranged in the chassis housing and emitting heat heating airstreams flowing proximal to the heat source to a second temperature higher than the first temperature, and mixing, via an air mixer, the airstreams at the second temperature with surrounding airstreams at a temperature lower than the second temperature to result in an overall lower temperature at at least one component downstream of the heat source and the air mixer.

The method may further include flowing air through a plurality of flow-through apertures in at least one of the first and second diverter plates.

According to an aspect of the disclosure, a system includes a chassis housing a plurality of hardware components, an air intake configured to direct a plurality of airstreams at a first temperature into the chassis, a heat source arranged in the chassis housing, the heat source arranged such that airstreams of the plurality of airstreams flowing proximal to the heat source get heated to a second temperature higher than the first temperature and airstreams of the plurality of airstreams distal to the heat source have temperatures between the first temperature and the second temperature, at least one component downstream of the heat source, and an air mixer arranged between the heat source and the at least one component, the air mixer configured to facilitate mixing air streams at the second temperature with surrounding air streams at a temperature lower than the second temperature to result in an overall lower temperature at the at least one component.

BRIEF DESCRIPTION OF THE DRAWINGS

FIGS. 4A-4D illustrate various embodiments of an air mixer, according to an aspect of the disclosure.

DETAILED DESCRIPTION

Figure 7:
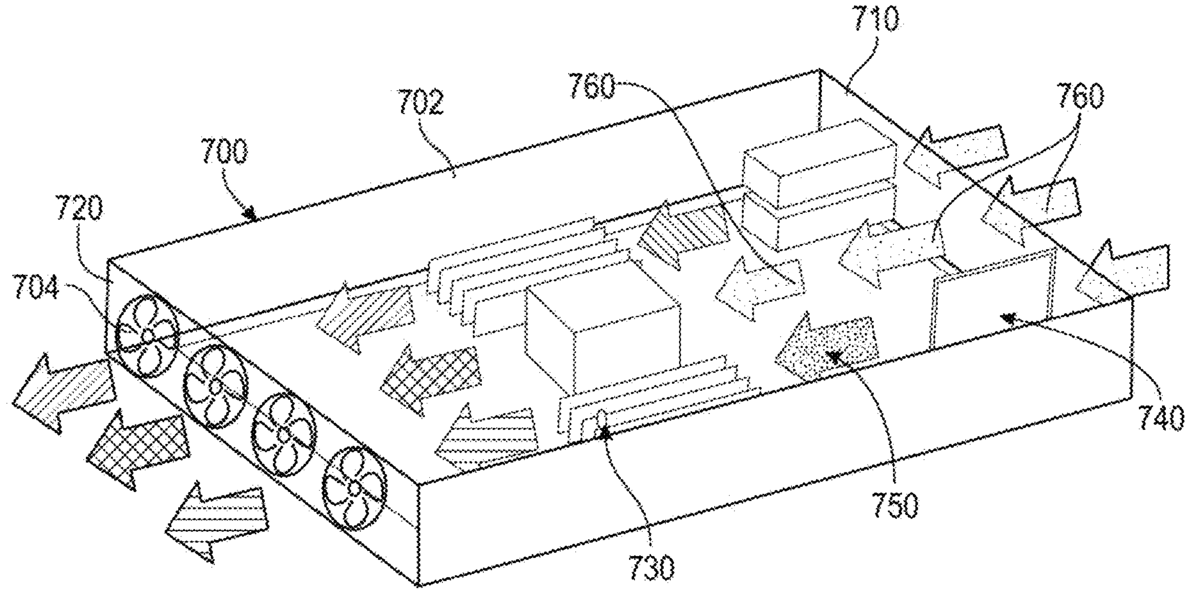
FIG. 7 schematically illustrates a known configuration wherein aspects of the current disclosure may be beneficially applied.

The technology relates generally to hotspot mitigation in computing equipment using enhanced air mixing. FIG. 7 illustrates a typical configuration of a computing equipment being air-cooled. In this regard, cool air is pulled into a chassis 702 of a server 700 by fans 704, for example. As illustrated, cool air enters server 700 at an intake end 710 of the chassis 702 and is pulled towards, and subsequently out of an exhaust end 720 of the chassis 702 by fans 704. The air absorbs heat from the components 740 in the server 700 as the air traverses through the chassis 702.

The flow of air through the computing equipment may have multiple paths. Each path of air may travel around, through, over, under, etc., components of the computing equipment. Each path the air travels may be considered an airstream. For example, the cool air flowing along the path 760 is at a first temperature, for example, at an ambient temperature. As the airstream flows directly past the heated component 740 is heated to a second temperature and is designated by the arrow 750. Other airstreams 760 flowing away from the heated component 740 remains at the first temperature.

An increase in the temperature of an airstream may depend on the airflow rate of the airstream and heat dissipation of components in the server the airstream travels in proximity to. As such, airstreams may have non-uniform heating, with some airstreams being warmer than others. Further, each airstream may have different temperatures at different locations as it traverses through the computing equipment, or the server 700, in this case. For example, airstream 750 may be heated by component 740, whereas airstream 760 is not heated by component 740. Thus, airstream 750 at an elevated temperature compared with the surrounding air streams, may increase the temperature of the downstream component 730. Thus, the location of the component 730 may develop into a hotspot, with locally higher temperatures.

Figure 8:
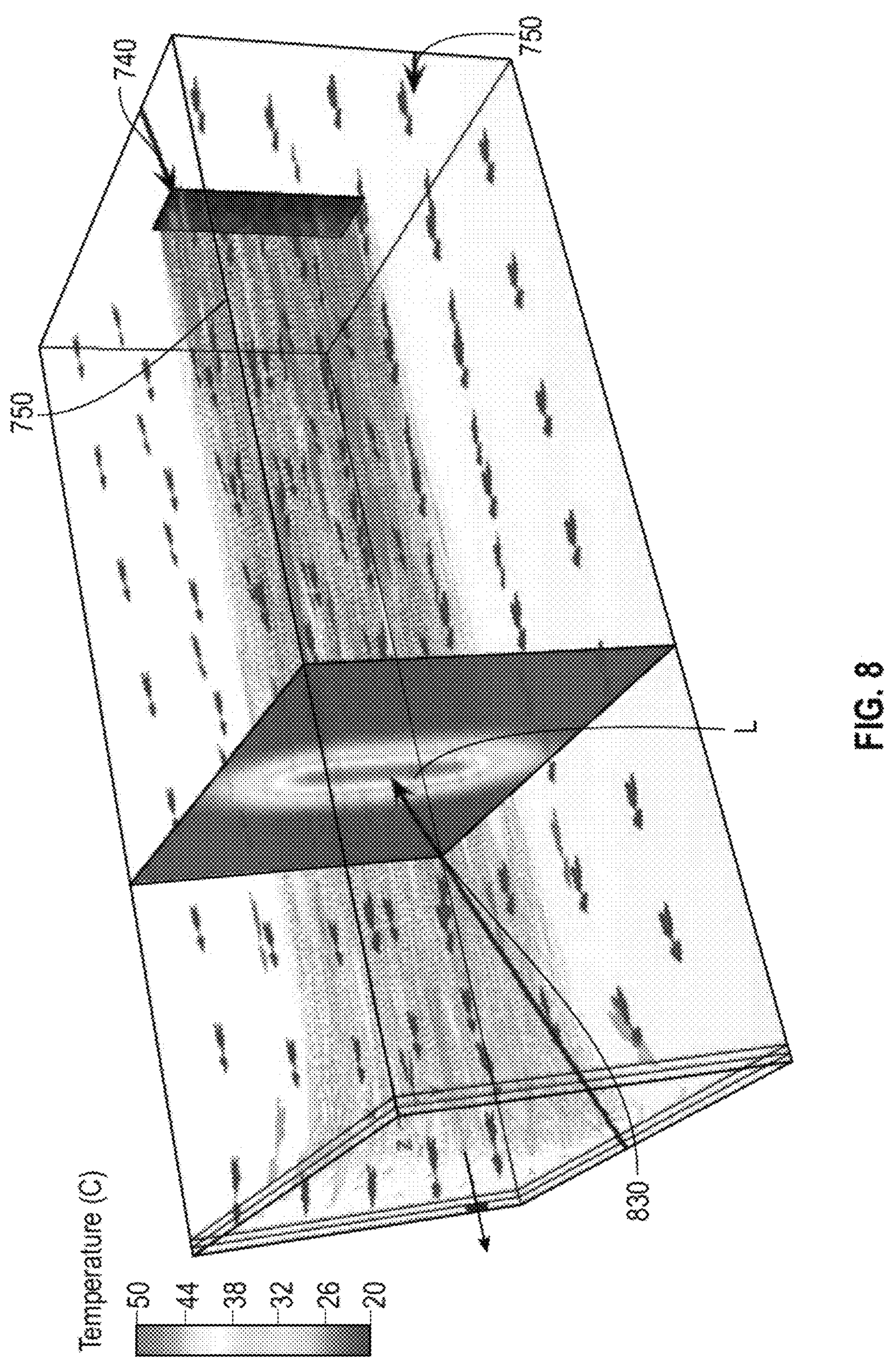
FIG. 8 illustrates a temperature gradient at a predetermined location downstream of a heat source.

FIG. 8 schematically illustrates air temperature gradient or distribution downstream of the component 740 and depicts the hotspot 830 at a location L downstream of the heat emitting component 740. At the location L, the highest temperature is depicted at the center of the cross-section, with temperatures gradually dropping at locations distal from the center of the cross-section.

Figure 1:
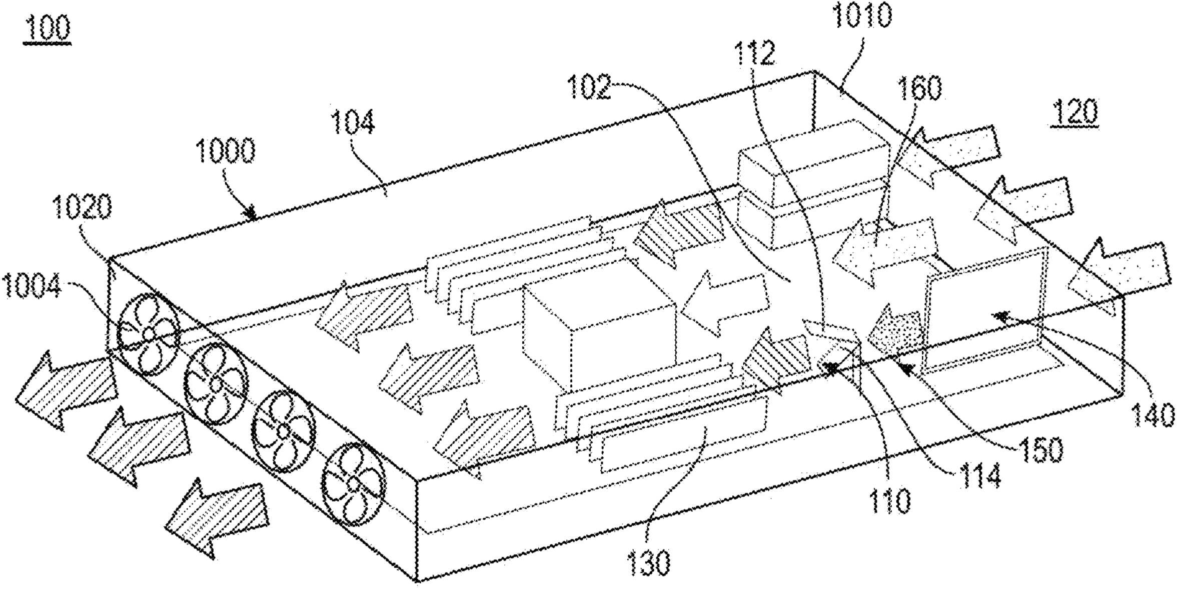
FIG. 1 is a schematic view of a system including a mixer according to aspects of the disclosure.

FIG. 1 illustrates a hotspot mitigation system 100 positioned within a server 1000. The server 1000 includes a chassis 104 with an intake end 1010, several components 140 mounted within the chassis 104 proximal to the intake end 1010 and several components 130 mounted within the chassis 104 downstream of the intake end 1010 toward an exhaust end 1020. Examples of the components 140 may include a network interface card, storage devices, a Graphic Processing Unit ("GPU"), and Compute Express Link ("CXL") devices. Examples of the components 130 may include memory modules, processors, voltage regulators, and boot drives. The server 1000 further includes a plurality of fans 1004 at the exhaust end 1020 in the illustrated example. In other examples, fans 1004 may be arranged, alternatively or additionally, at the intake end 1010 or somewhere between the exhaust end 1020 and the intake end 1010. The hotspot mitigation system 100 includes a mixing enhancer 110, or an air mixer, positioned between the cool air intake 1010 of the chassis 104 and components 130 downstream of the airflow. In other examples, the air mixer 110 can be positioned between any two components along the same airflow path, whether proximal to the air intake 1010 or proximal to the air exhaust 1020 or somewhere in between. While the mixing enhancer 110 is also referred to as an air mixer, the mixing enhancer 110 can be employed along with other fluids as well and is not limited only to air.

In many cases, the airflows in a server travel in parallel directions. However, components of the server may cause the airflows to redirect around the components, such as over, under, between, etc. The airstreams entering at the cool air intake 120 are at a first temperature, for example, an ambient temperature, and flow past a heat emitting component 140. The airstreams 150 proximal to the heated component 140 heat up to a second temperature higher than the first temperature. Other airstreams 160 distal from the heat emitting component 140, may remain cooler, such as at the ambient temperature, or at temperatures lower than the second temperature. There is little diffusion of heat naturally between the generally parallel cooler airstreams 150 and the heated airstreams 160. However, the mixing enhancer 110 redirects the airstreams 150, 160 and can enhance mixing of the hot airstreams 150 and the cool airstreams 160. Such enhanced mixing results in a more uniform air temperature distribution and may mitigate any hotspots downstream of the intake 120. Hardware components 130 downstream of the air intake 120 and the air mixer 110 remain at cooler temperatures compared to the temperatures in the absence of the air mixer 110.

Figure 2:
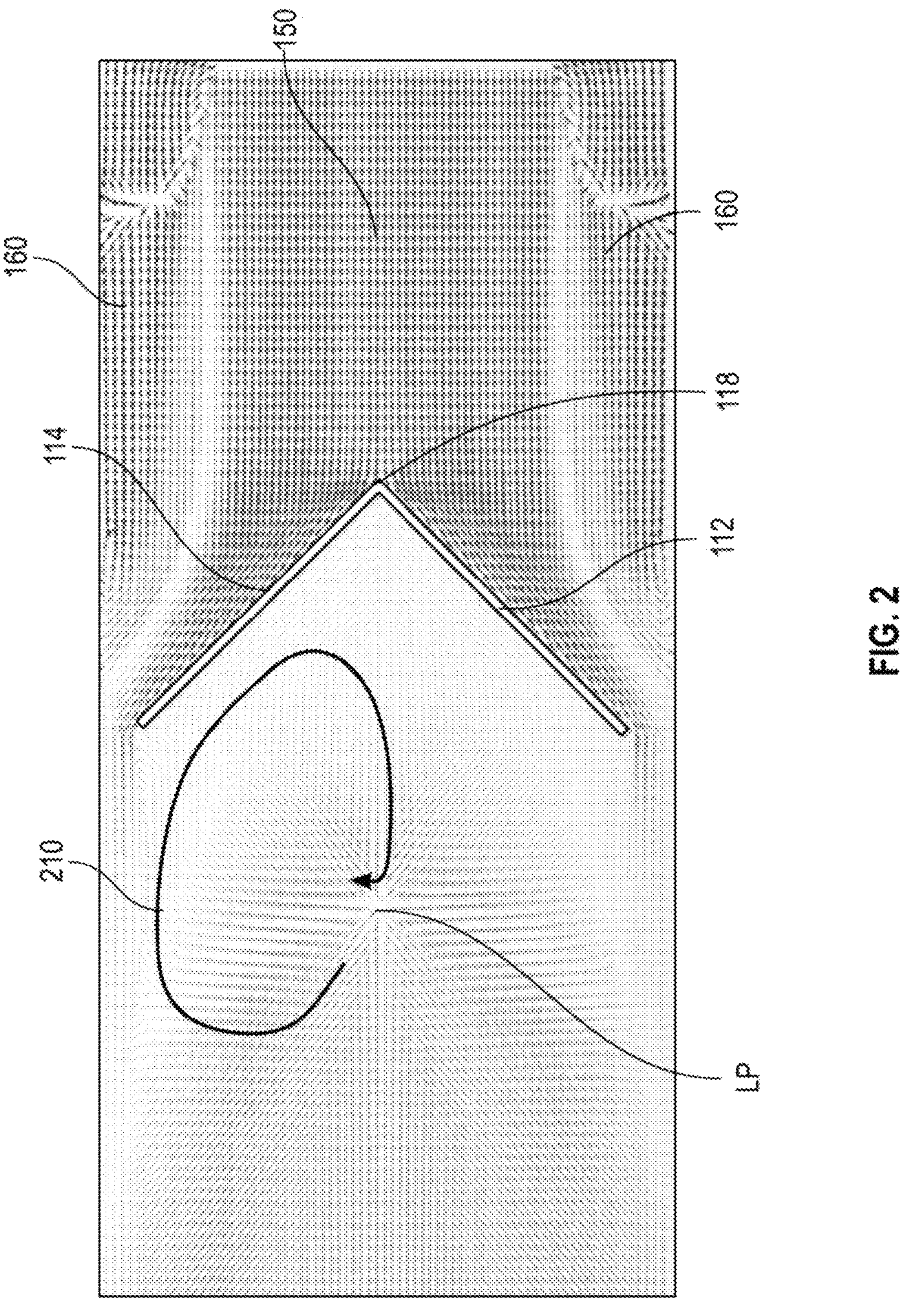
FIG. 2 is a schematic side view of the system of FIG. 1 illustrating hot and cooler airflows mixing downstream of the mixer.
Figure 3:
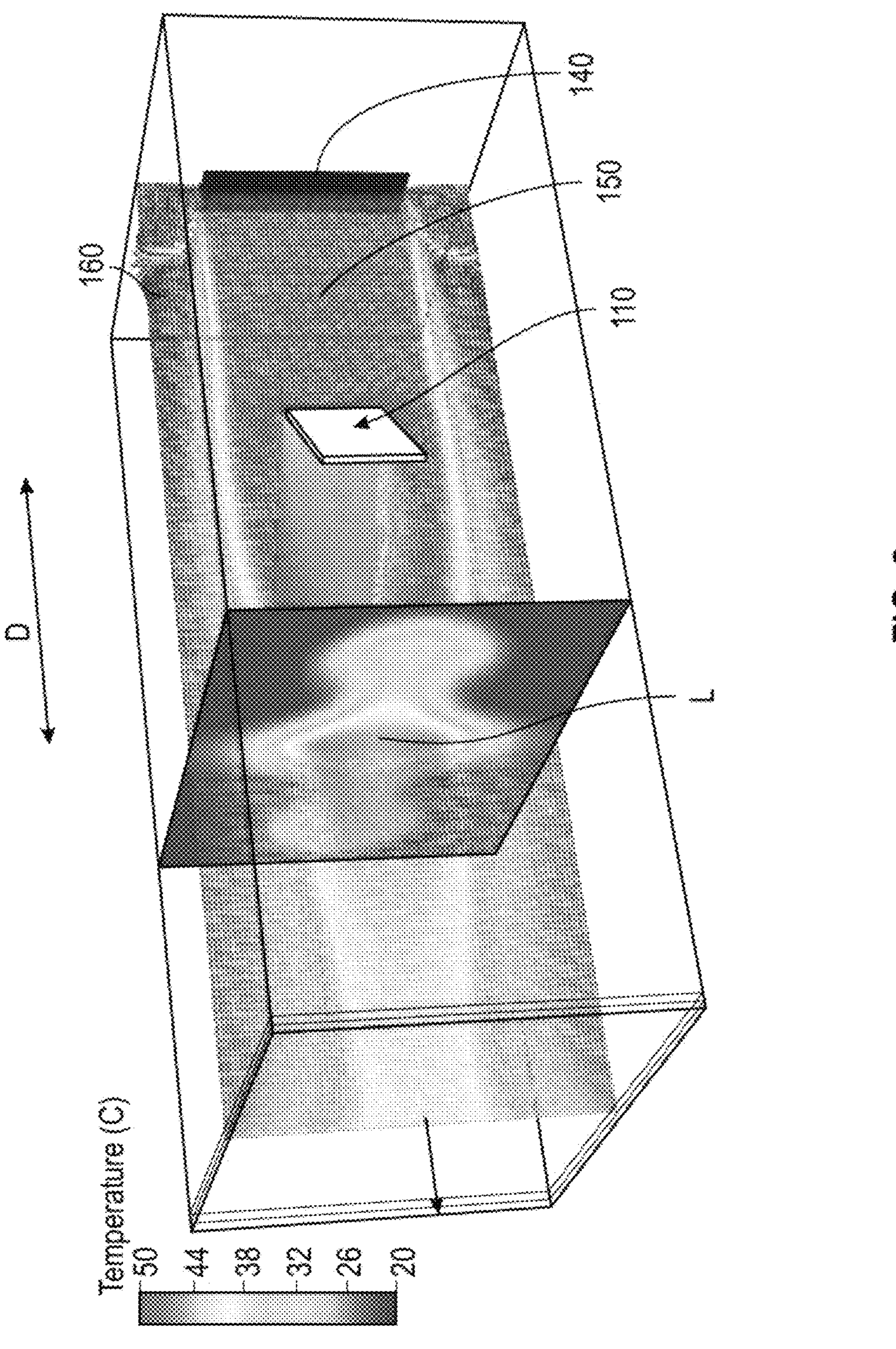
FIG. 3 is a schematic isometric view of a temperature gradient at a predetermined spot downstream of the mixer, according to an aspect of the disclosure.

Referring to FIGS. 2 and 3, the hot airstreams 150 and the cold airstreams 160 are diverted by the air mixer 110. The air mixer 110 creates a pressure drop in the airflow downstream of the mixer 110 at a location LP and may generate a three-dimensional vortex 210 that can enhance the mixing of the hot and cool airstreams 150, 160. As the hot airstreams 150 and the cool airstreams 160 mix downstream of the air mixer 110, the temperatures at locations downstream of the air mixer 110 drop. The drop in the temperatures help mitigate any hotspots which would have developed in the absence of the air mixer 110, such as hotpots 830 shown in FIG. 8.

FIG. 3 schematically illustrates temperature distribution at the predetermined location L at a distance D downstream of the air mixer 110. Referring back to FIG. 8, which illustrates the temperature distribution at the location L in absence of the air mixer 110, it is seen that the rise in the temperature at the location L is mitigated when the air mixer 110 is positioned downstream of the hot component 140 and upstream of the downstream component 130.

Referring to FIGS. 4A-4D, various examples of the air mixers 400A-400D are shown, wherein the air mixer 400 includes a first diverter plate **112*a*-112*d* and a second diverter plate 114*a*-114*d*. In all illustrated embodiments of FIGS. 4A-4D, the first diverter plates 112*a*-112*d* and the second diverter plates 114*a*-114*d* are arranged at an angle α relative to one another in a V-shaped configuration. For instance, mixer 400A of FIG. 4A includes a first diverter plate 112*a* arranged at angle α relative to a second diverter plate 114*a*. Depending on the requirements of the environment where an air mixer 400 may be implemented, the angle α between the first and second diverter plates 112, 114 can be changed to change the extent of the mixing of the airstreams and flow impedance. In some examples, the angle α between the first and second diverter plates 112, 114 may be adjustable, for example manually or via an electrical motor (not shown) or a piezoelectric element (not shown). In an example, the air mixer 400A includes a hinge 116***a* connecting the first diverter plate 112*a* and the second diverter plate 114*a*.

In other embodiments, the air mixer 110 may include more than two or fewer than two diverter plates. The air mixer 110 may also assume other shapes such as a "W" or a "U" (not shown) in other examples.

In the example mixer 400A illustrated in FIG. 4A, a shape of the first diverter plate 112*a* and a shape of the second diverter 114*a* plate are identical. For example, each of the first and second diverter plates 112*a*, 114*a* are rectangular, as illustrated in FIG. 4A. In another example, the shape of the first diverter plate may be different than the shape of the second diverter plate.

FIG. 4B illustrates the mixer 400B where the first diverter plate 112*b* is rectangular in shape, the second diverter plate 114*b* is triangular in shape. Thus, the air mixer 110 may have different combinations of shapes for the first diverter plate and the second diverter plate. While not illustrated, both the first diverter plate 112 and the second diverter plate 114 may be triangular or any other suitable shape.

In one implementation, the width of the first and second diverter plates 112, 114 at a joint 118 where the diverter plates 112, 114 meet correspond generally to the width of the upstream heat emitting component 140, or slightly wider. For instance, the width at the joint 118 may be up to 50% wider than the width of the upstream component 140. Such a correspondence may increase the pressure drop create a low-pressure region downstream of the mixer 110, thereby enhancing the mixing of the cool airstreams 160 and the hot airstreams 150. The dimensions and the angle α of the first and second diverter plates 112, 114 may be optimized to achieve an optimum mixing without increasing airflow impedance significantly.

In examples illustrated in FIGS. 4C and 4D, at least one or both of the first diverter plate 112 and the second diverter plate 114 includes a plurality of flow-through apertures 119. Such flow-through apertures 119 may enhance the mixing of the airstreams 150, 160 downstream of the air mixer 110 resulting in a more homogenous temperature distribution downstream of the mixer 110 and may reduce airflow impedance. The flow-through apertures 119 may enhance mixing by creating multiple small jets of airflow. While the illustrated examples include flow-through apertures 119 have circular and square shapes and are arranged in a grid or an array, it will be understood that the flow-through apertures 119 may have other arrangement and shapes, such as circular, oblong, triangular, hexagonal, trapezoidal, etc., without departing from the scope of the disclosure.

Figure 5A:
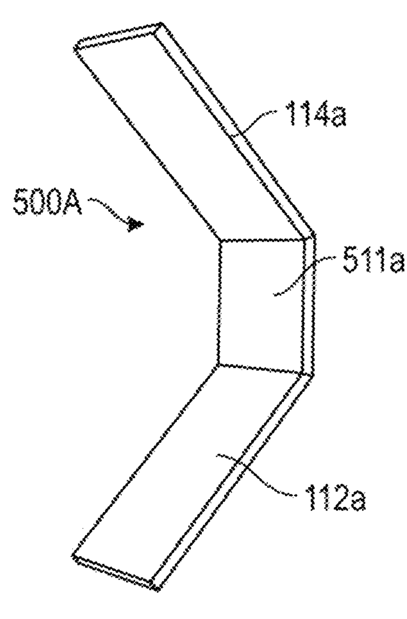
FIGS. 5A-5D illustrate various embodiments of an air mixer, according to another aspect of the disclosure.

In yet other examples illustrated in FIGS. 5A-5D, the mixers 500A-500D include a plate 511*a*-511*d* oriented perpendicular to a direction of the plurality airstreams 150, 160 and positioned between the first diverter plate 112 and the second diverter plate 114. Such plates 511*a*, 511*b* create a larger local low-pressure region behind the plates 511*a*, 511*b*. In one implementation, the plate 511*b* includes a plurality of flow-through apertures 519. FIG. 5A illustrates the air mixer 500A with the first diverter plate 112*a*, the second diverter plate 112*b* and a plate 511*a* arranged between the first diverter plate 112*a* and the second diverter plate 112*b*. None of the first diverter plate 112*a*, the second diverter plate 112*b*, and the plate 551*a* has any flow-through apertures.

Figure 5B:
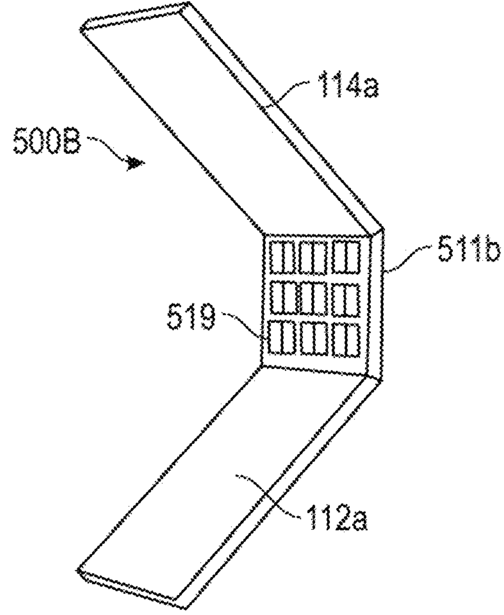
Figure 5C:
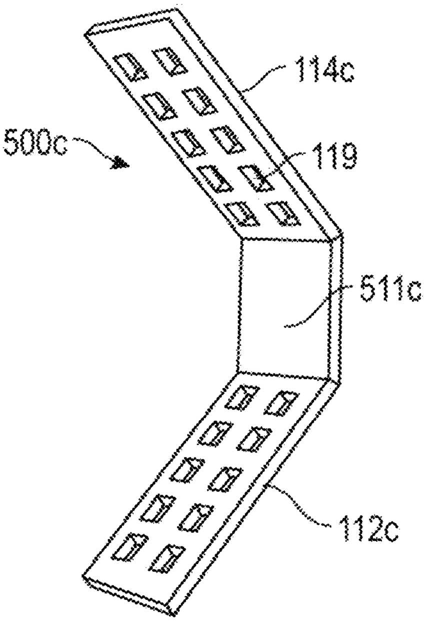
Figure 5D:
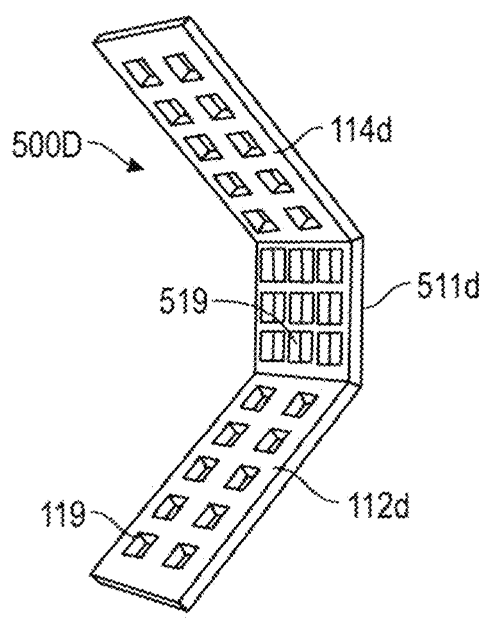

FIG. 5B illustrates the air mixer 500B with the first diverter plate 112*a*, the second diverter plate 112*b* and the plate 511*b*. The plate 511*b* includes a plurality of flow-through apertures 519 defined therethrough. FIG. 5C illustrates the air mixer 500C with the first diverter plate 112*c*, the second diverter plate 114*c* and the plate 511*c*. In this embodiment, each of the first diverter plate 112*c* and the second diverter plate 114*c* includes flow-through apertures 119, while the plate 511*c* does not include any flow-through apertures. Finally, FIG. 5D illustrates the air mixer 500D with the first diverter plate 112*d*, the second diverter plate 114*d* and the plate 511*d*. In this example, both of the first diverter plate 112*d* and the second diverter plate 114*d* include the flow-through apertures 119 defined therethrough and the plate 511*d* includes the flow-through apertures 519 defined therethrough. It will, therefore, be understood that various combinations of first diverter plate 112, second diverter plate 114, and the plate 511*a*, with or without flow-through apertures 119, 519 are within the scope of the disclosure The flow-through apertures 119, 519 produce local jets of flow and enhance the mixing of the airstreams 150, 160 downstream of the air mixers 500B-500D resulting in a more homogenous temperature distribution downstream of the mixers 500B-500D and reduces airflow impedance.

Referring now to FIGS. 6A-6D, each of the air mixers 600A-600D include the first diverter plate 112 and the second diverter plate 114 which are conical in shape. The conically shaped first and second diverter plates 112, 114 may define a first lateral gap 115 and a second lateral gap 117 therebetween.

Figures 6A, 6B, 6C, 6D:
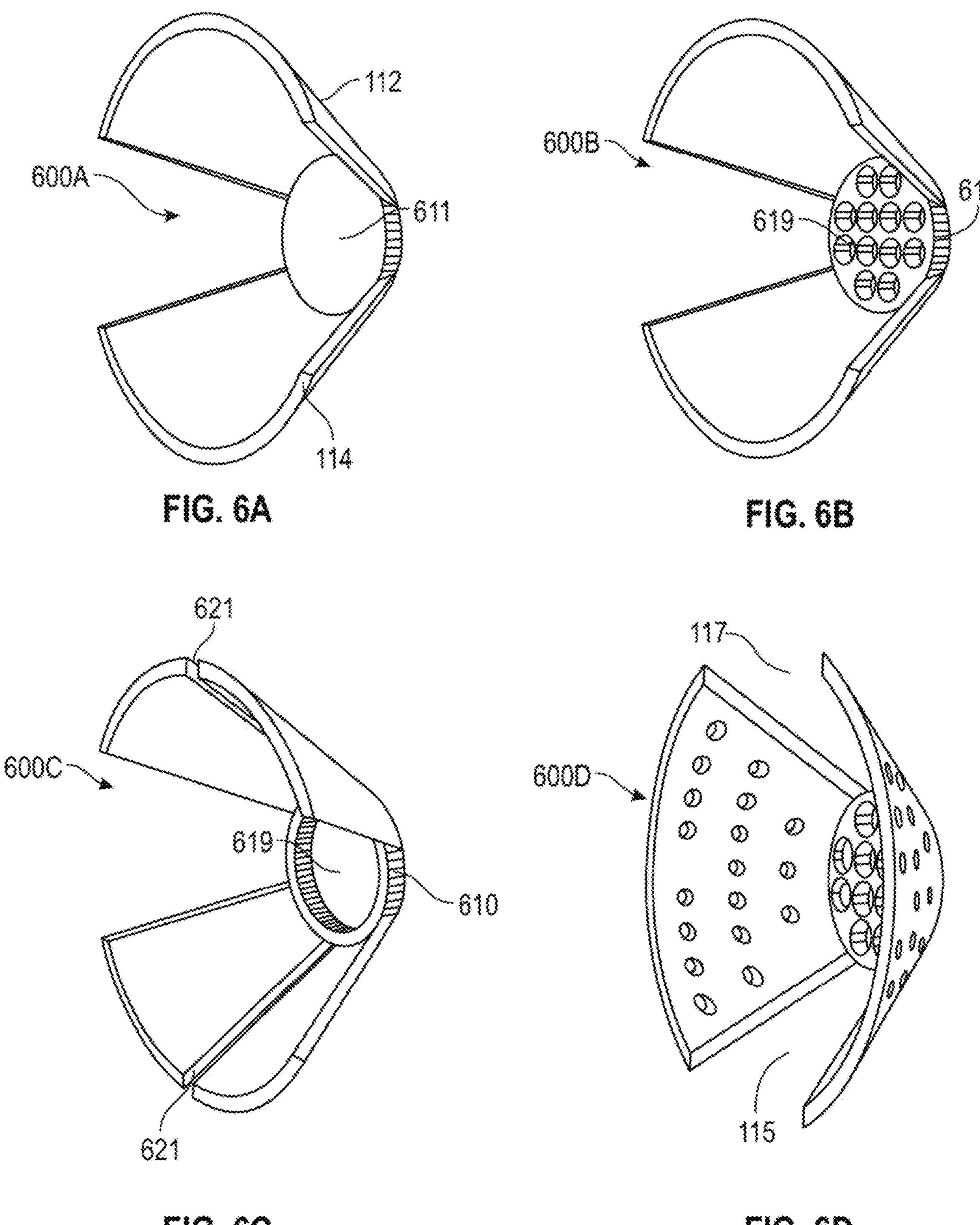
FIGS. 6A-6E illustrate various embodiments of an air mixer, according to yet another aspect of the disclosure.

In the illustrated examples of FIGS. 6A-6C, the first and second lateral gaps 115, 117 are so oriented that the first diverter plate 112 forms an upper diverter plate while the second diverter plate 114 forms a lower diverter plate. The first and second diverter plates 112, 114, in cooperation with the first and second lateral gaps 115, 117 enhance the mixing of the hot and cool airstreams 150, 160, thereby facilitating homogeneous temperature distribution downstream of the mixer 110.

FIG. 6A illustrates the mixer 600A including a plate 611 connecting the first and second conical diverter plates 112, 114. FIG. 6B illustrates the air mixer 600B where the plate 611 includes a plurality of flow-through apertures 619. Referring to FIG. 6C, the mixer 600C includes a ring 610 connecting the first and second conical diverter plates 112, 114. The ring 610 defines a central aperture 619 through which the airstreams 150, 160 flow. Referring to FIG. 6D, one or both of the first and second diverter plates 112, 114 of the air mixer 600D include a plurality of flow-through apertures 619. In the example shown in FIG. 6B, one or both of the first and second conical diverter plates 112, 114 of the air mixer 600B include a slit 621.

Figure 6E:
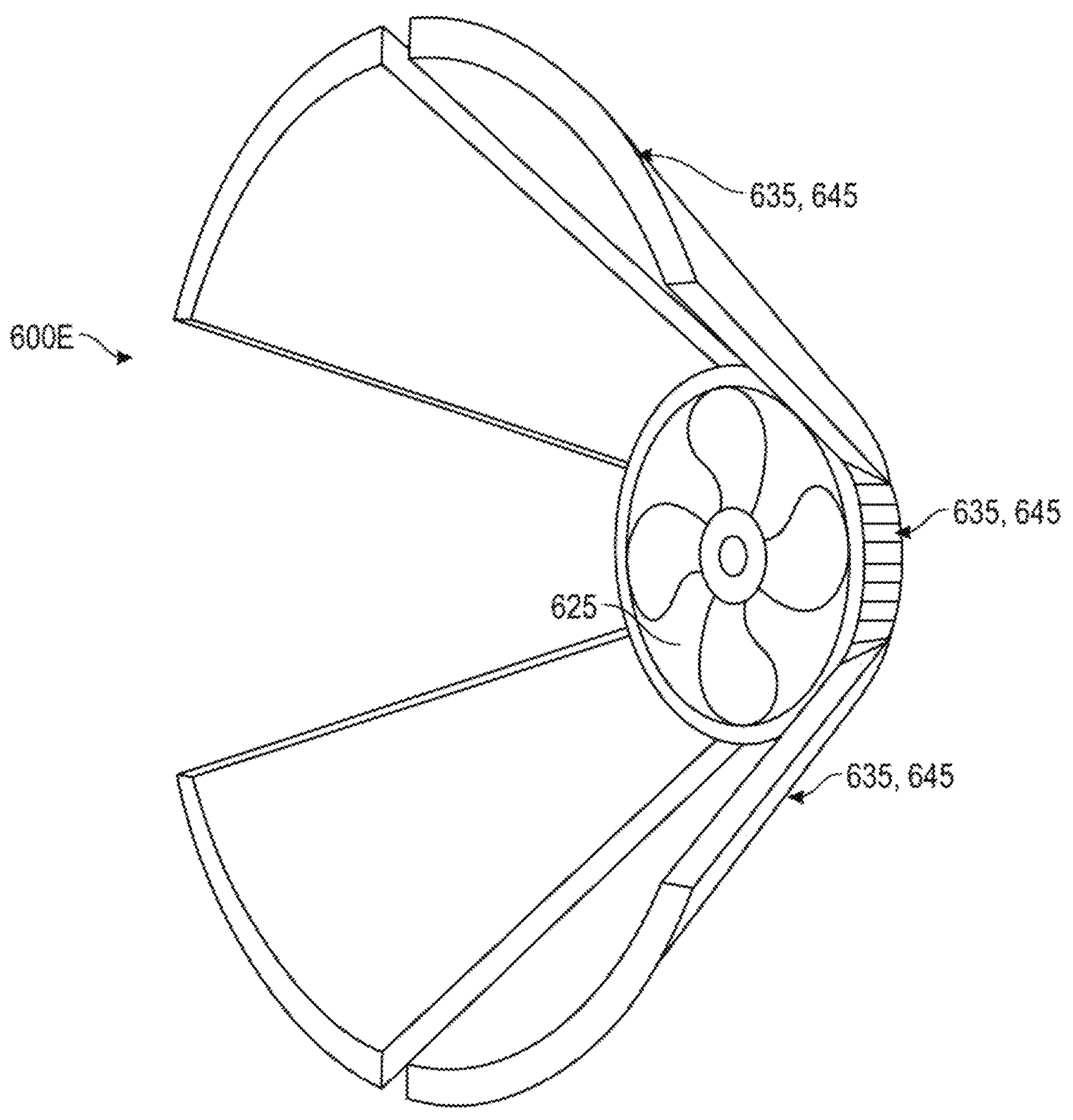

FIG. 6E illustrates an air mixer 600E includes a passive propeller 625 at a junction of the first and second diverter plates 112, 114. While the illustrated embodiment of FIG. 6E shows the passive propeller 625 along with conical first and second diverter plates 112, 114, other examples may include a passive propeller with first and second diverter plates of other shapes as well such as illustrated in FIGS. 5A-5C. The passive propeller 625 facilitates in introducing turbulence to the airstreams 150, 160 impinging upon the mixer 110, which in turn enhances the mixing of the cool and hot airstreams 150, 160.

In some implementations, the air mixer 110 includes an active device, for example a fan or a blower, at the junction of the first and second diverter plates, instead of the passive propeller 625. Such a fan may facilitate introducing turbulence to the adjacent airstreams, thereby enhancing the mixing of the cool and hot airstreams 150, 160 leading to a more homogeneous temperature distribution downstream of the mixer 110. Also, the fan may be used to actively control the pressure differential between upstream and downstream of the air mixer 110 based on pressure measurements at upstream and downstream of the air mixer 110 via changing the speed of the fan. Sensors and systems for measuring pressures are well known and therefore not described in detail here. Likewise, controls for fans or blowers are also known and not described in detail here.

In yet another example illustrated in FIG. 6E, the propeller 625 is used to generate electricity, which may be used, for example, to adjust the angle between the first and second diverter plates 112, 114 via an electrical motor 635 or a piezoelectric element 645. The electrical motor 635 or the piezoelectric element 645 are configured to receive electricity from the propeller 625 and move the first and second diverter plates 112, 114 towards or away from one another. Such an arrangement may also be employed with other embodiments described above.

Figure 9:
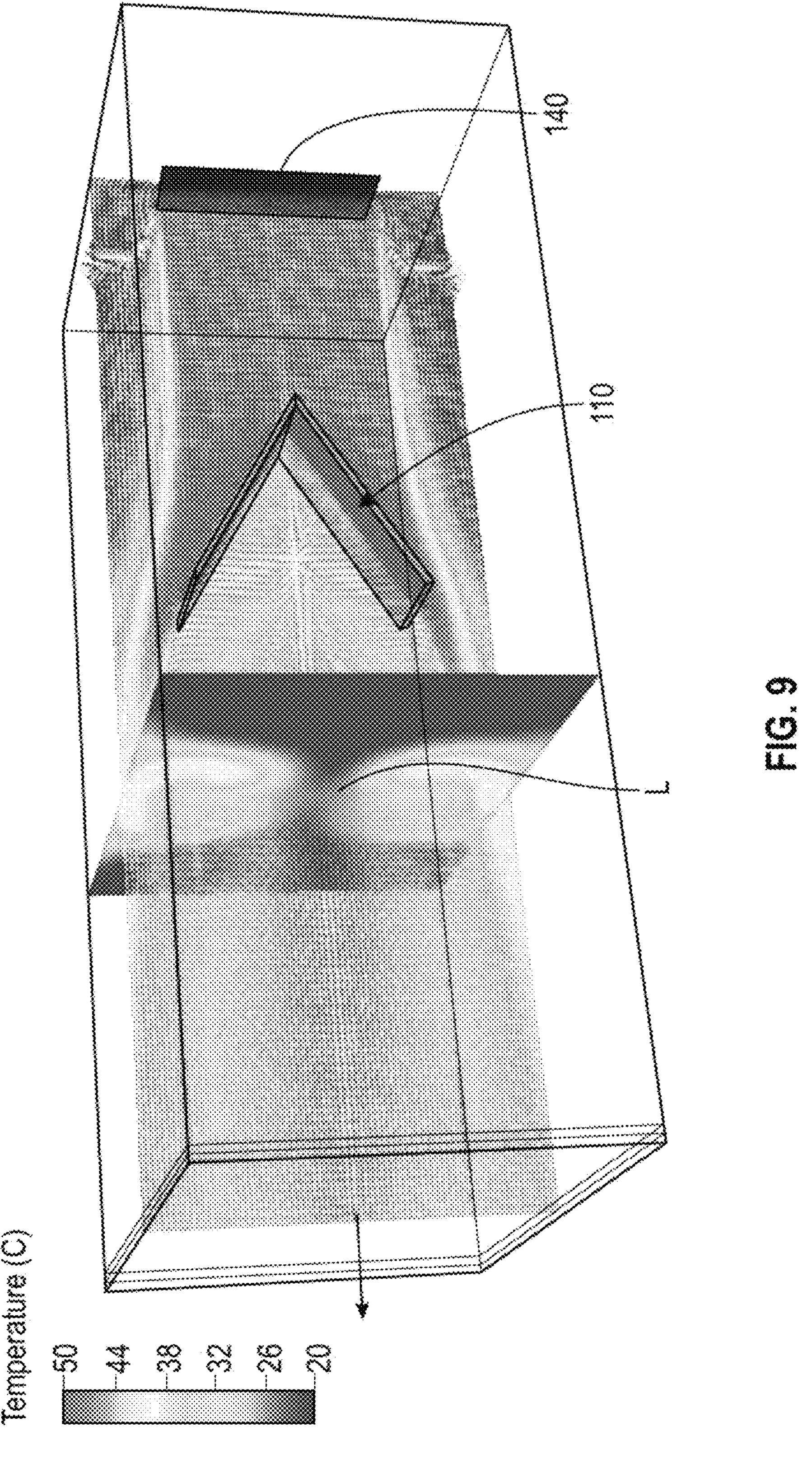
FIG. 9 is a schematic view of a temperature gradient at a predetermined location downstream of an air mixer, according to another aspect of the disclosure.
Figure 11:
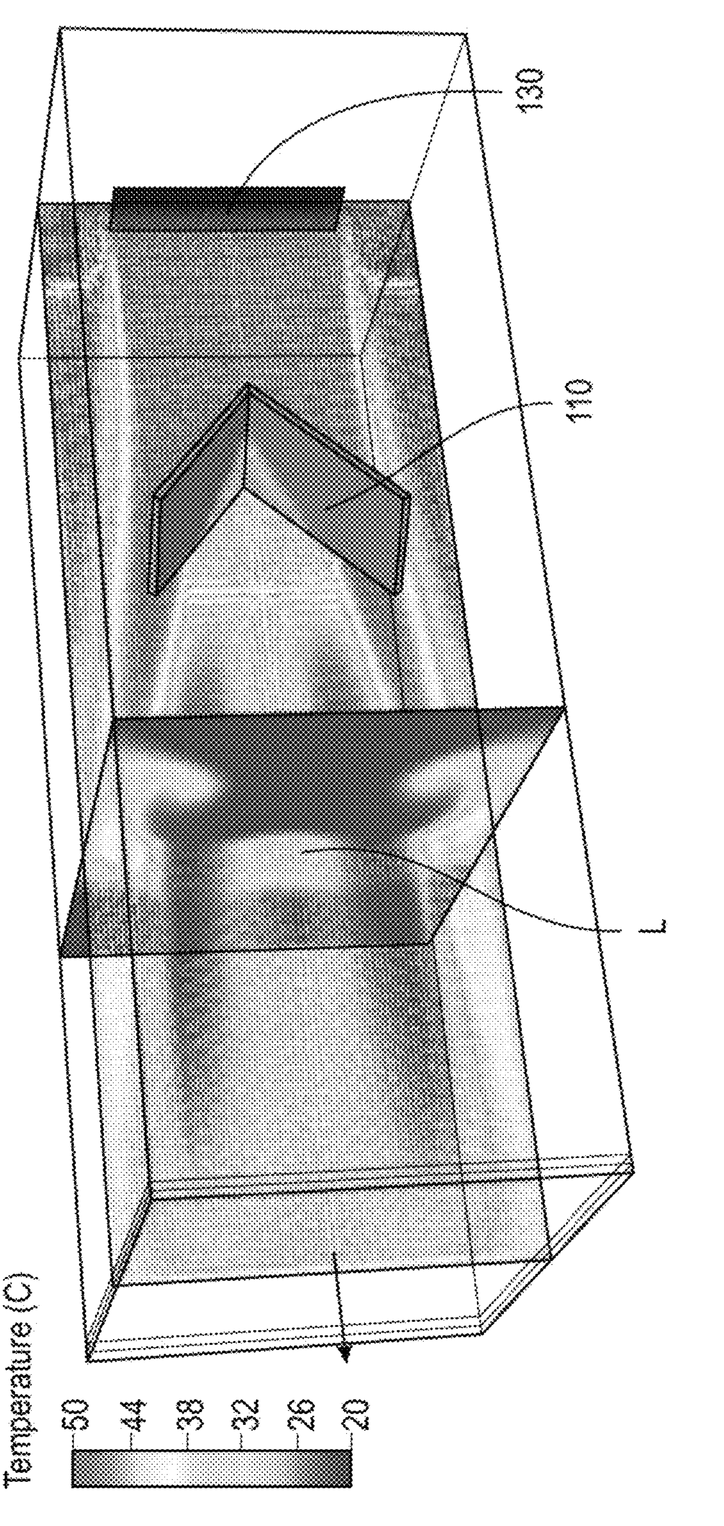
FIG. 11 is a schematic view of a temperature gradient at a predetermined location downstream of an air mixer, according to another aspect of the disclosure.
Figure 12:
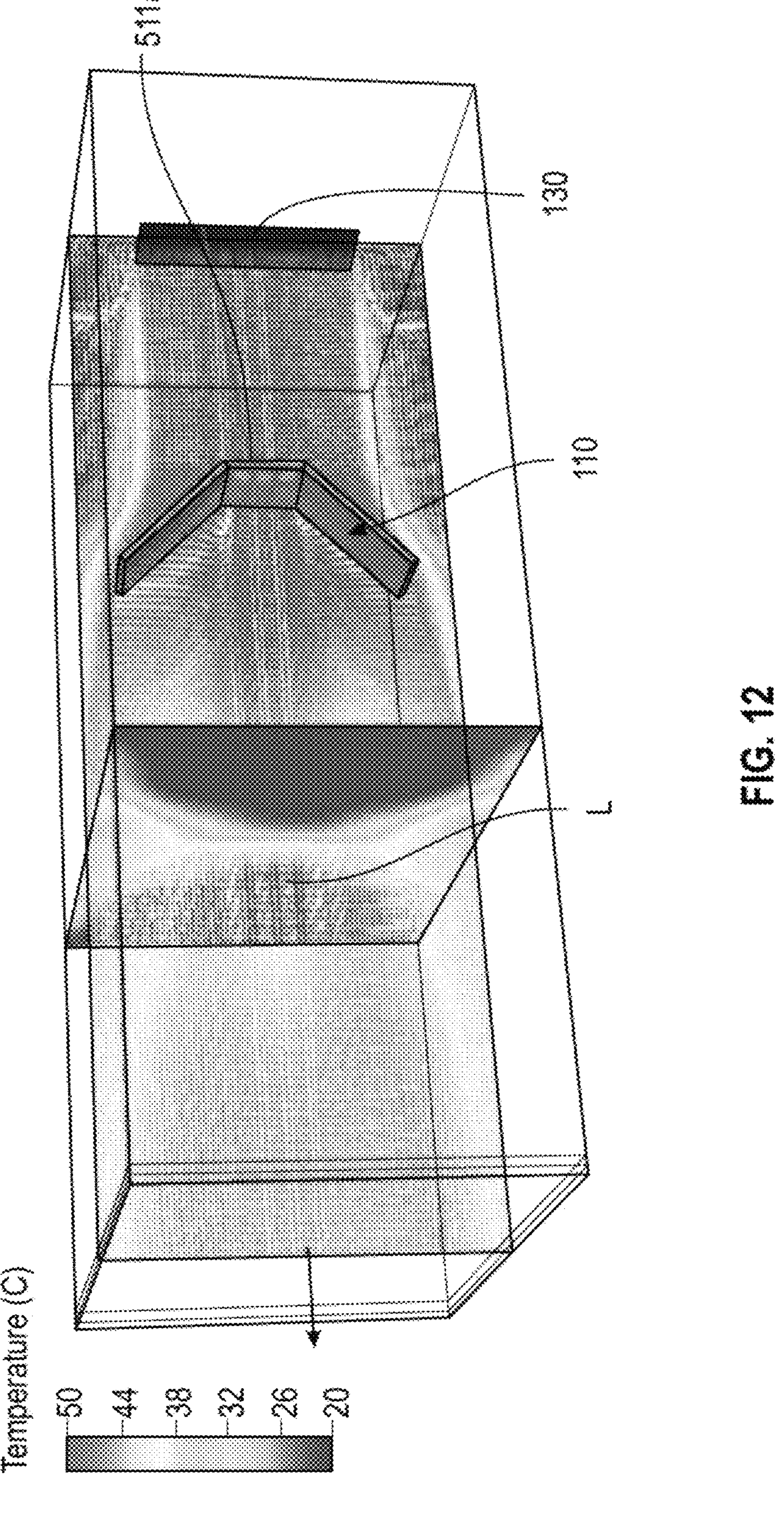
FIG. 12 is a schematic view of a temperature gradient at a predetermined location downstream of an air mixer, according to yet another aspect of the disclosure.
Figure 13:
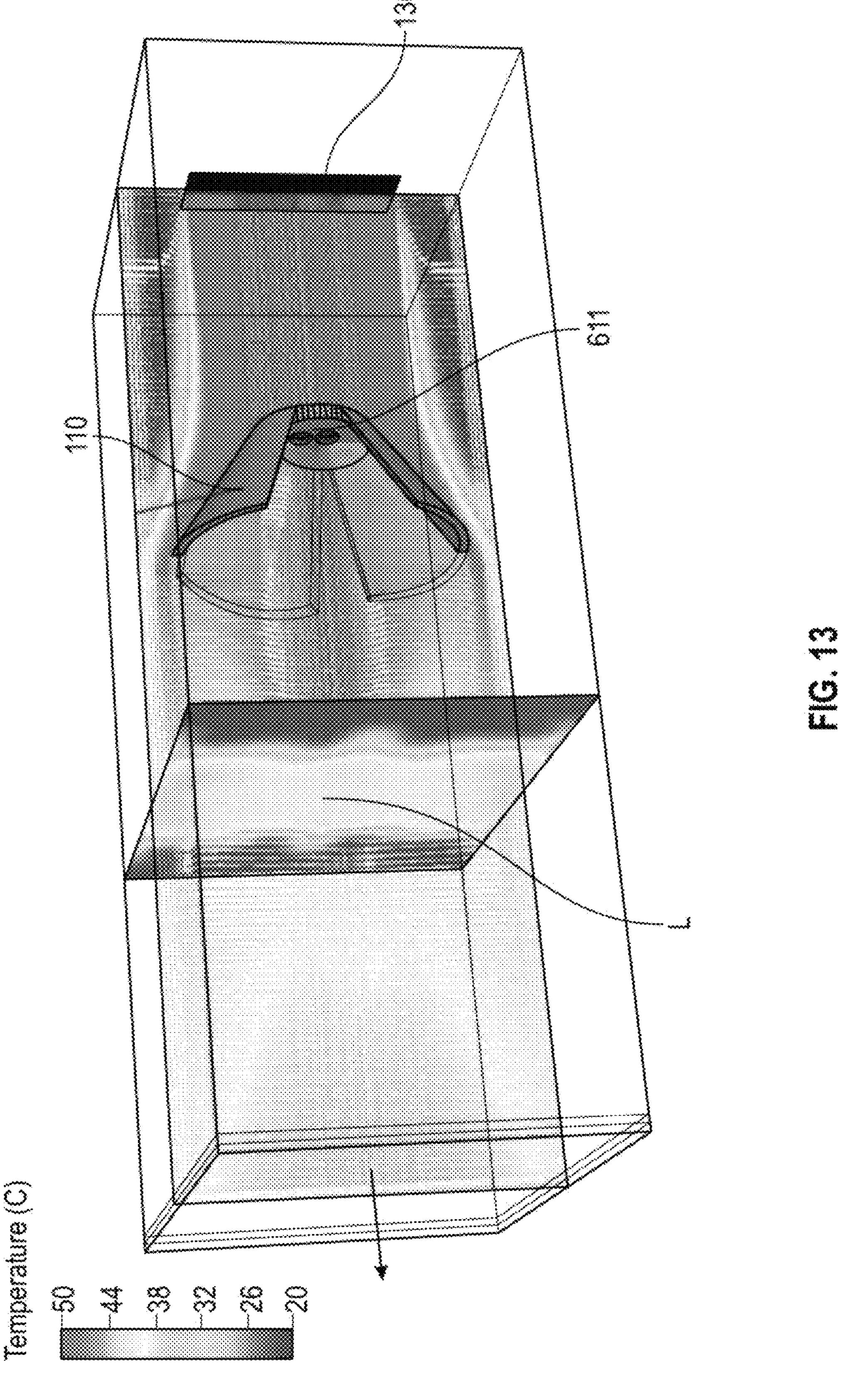
FIG. 13 is a schematic view of a temperature gradient at a predetermined location downstream of an air mixer, according to another aspect of the disclosure.

Depending on the requirements of an application, the air mixer 110 may be placed in different orientations relative to a chassis surface 102, for example, a motherboard. For instance, in one case, the first and second diverter plates 112, 114 are placed generally perpendicular to the chassis surface 102 such that a lateral edge of each of the first and second diverter plates 112, 114 is generally parallel to the chassis surface, as shown in FIGS. 2 and 3. In another case, only one vertical edge of one of the first and second diverter plates 112, 114 is generally parallel to the chassis surface such the connected diverter plate 114 defines an angle with the chassis surface 102, as shown in FIGS. 1 and 9. In yet another case, a vertical edge or a lateral edge of one of the diverter plates 112, 114 is oriented at an angle relative to the chassis surface, as shown in FIG. 11.

Figure 10:
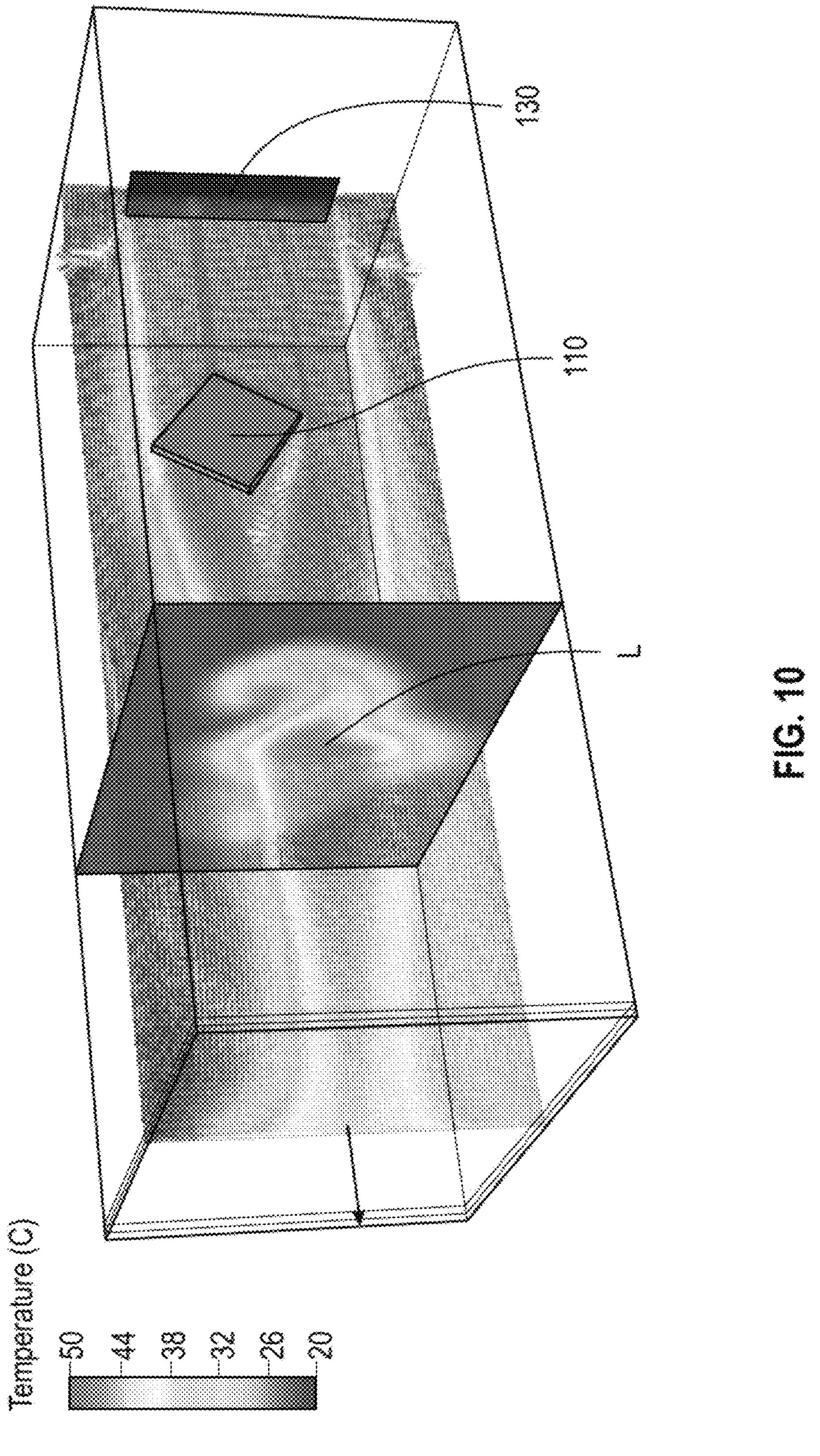
FIG. 10 is a schematic view of a temperature gradient at a predetermined location downstream of an air mixer, according to another aspect of the disclosure.

FIG. 10 illustrates yet another example of the air mixer 110 and the resulting temperature distribution and gradient at the location L downstream from the mixer 110 and the heat emitting component 130.

In an example, the air mixer 110 is positioned generally midway between the heat emitting component 140 and the downstream component 130 where the hotspot 830 is intended to be mitigated. In other examples, the air mixer 110 is arranged closer to the heat emitting component 140 or closer to the downstream component 130, depending on the desired temperature gradient at a given location relative to the heat emitting component 140. In one implementation, the air mixer can be a part of the cooling mechanism of either the heat emitting component 140 or the downstream component 130. In another case, the air mixer 110 may be mounted to the motherboard 102. In yet another example, the air mixer 110 may be mounted to a top cover (not shown) of the chassis 104. The location of the air mixer can also depend on the mechanical constraints associated with the chassis 104 and the components mounted therewithin.

Figure 14:
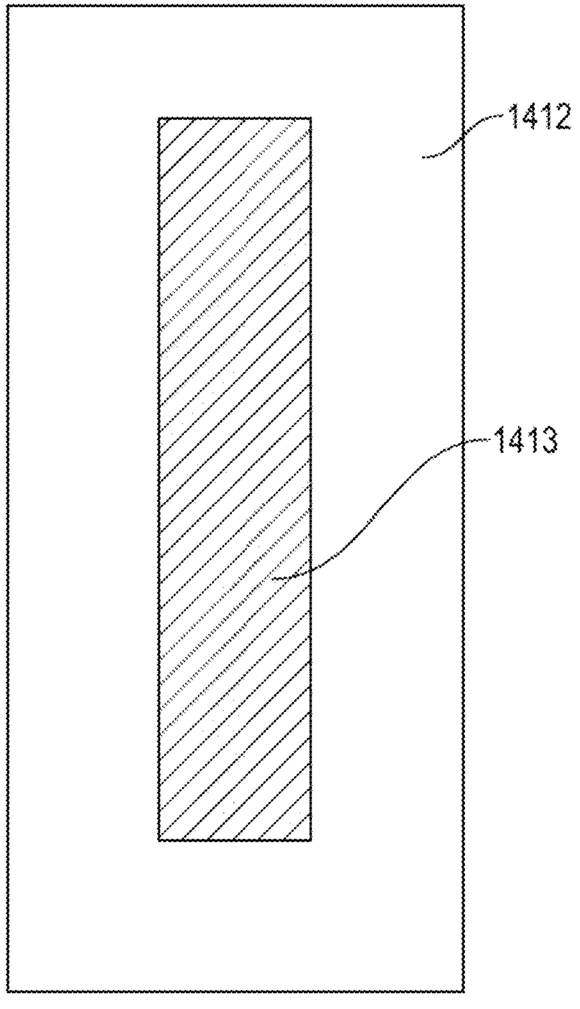
FIG. 14 is a schematic cross-section of a diverter plate according to an aspect of the disclosure.

In one implementation, the first and second diverter plates 112, 114 are made of a lightweight material such as plastic. In another implementation, the first and second diverter plates 112, 114 are made of a metal such as copper or aluminum. Other metals and polymers may also be used. Referring now to FIG. 14, one or both of the first and second diverter plates 112, 114 include a hollow body 1412 encompassing a phase change material 1413 or a material with large specific heat capacity relative to that of the hollow body 1412. In a transient situation where the air mixer 110 is subjected to a sudden increase in the temperature via the hot airstream 150, the phase change material 1413 can absorb some of the heat and reduce impact on the downstream component 130. Thus, the air mixer 110 may also serve as a thermal damper in this example. The diverter plates 112, 144 will absorb some of the heat from the heated airstreams 150 until a thermal equilibrium is reached with the adjacent airstreams 160. Such damping may protect the downstream component 130 from getting subjected to sudden heat spikes due to a sudden increase in the heat generated by the heat emitting component 140. and carried over by the airstreams 150.

An advantage of the air mixer 110 is improved operational conditions, efficiency, reliability and component lifetime. For example, in absence of such an air mixer 110, the memory module 130 downstream of the high-power network interface card 140 may become excessively hot. This in turn would case a controller to operate the fans at higher speeds to cool down the memory module 130 even if only one memory module 130 is overheated while other memory modules 130 are below the temperature threshold. The air mixer 110 may help achieve a more uniform temperature distribution in the chassis 104 and avoid operation of the fans at higher speeds due to one or more local hotspots 830 on one or more specific components. Such uniform temperature distribution would also improve the reliability of the system and lifespan of the fans. Improved system reliability may further result in a reduction in downtime required for maintenance.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the examples should be taken by way of illustration rather than by way of limitation of the subject matter defined by the claims. In addition, the provision of the examples described herein, as well as clauses phrased as “such as,” “including” and the like, should not be interpreted as limiting the subject matter of the claims to the specific examples; rather, the examples are intended to illustrate only one of many possible examples. Further, the same reference numbers in different drawings can identify the same or similar elements.

The invention claimed is:

1. A system comprising:

an air mixer arranged between a heat source and at least one location downstream from the heat source, wherein a plurality of airstreams flow in a direction from the heat source towards the at least one location, and wherein the air mixer is configured to mix surrounding airstreams of the plurality of airstreams at a first temperature with airstreams of the plurality of airstreams at a temperature higher than the first temperature to result in an overall lower temperature at the at least one location, wherein the air mixer comprises a first diverter plate and a second diverter plate arranged at an angle relative to one another.

2. The system according to claim 1, wherein a shape of the first diverter plate is identical to a shape of the second diverter plate.

3. The system according to claim 2, wherein each of the first and second diverter plates is rectangular.

4. The system according to claim 1, wherein at least one of the first and second diverter plates is triangular.

5. The system according to claim 1, wherein at least one of the first and second diverter plates comprises a plurality of flow-through apertures.

6. The system according to claim 1, further comprising a plate oriented perpendicular to a direction of the plurality of airstreams.

7. The system according to claim 6, wherein the plate comprises a plurality of flow-through apertures.

8. The system according to claim 1, wherein each of the first and second diverter plates is conical.

9. The system according to claim 8, further comprising a plate oriented perpendicular to a direction of the plurality of airstreams.

10. The system according to claim 9, wherein the plate comprises a plurality of flow-through apertures.

11. The system according to claim 8, wherein at least one of the first and second diverter plates comprises a plurality of flow-through apertures.

12. The system according to claim 1, further comprising a passive propeller.

13. The system according to claim 1, further comprising an active device configured to generate airflow.

14. The system according to claim 1, wherein the air mixer comprises a hollow body and a phase change material encompassed within the hollow body.

15. The system according to claim 1, wherein the air mixer is configured to divert the plurality of airstreams away from one another, thereby creating a pressure drop downstream of the air mixer.

16. A method for mitigating a hotspot in a computing equipment, the method comprising:

directing a plurality of airstreams at a first temperature into an intake of a chassis housing a plurality of hardware components, a heat source arranged in the chassis housing emitting heat heating airstreams flowing proximal to the heat source to a second temperature higher than the first temperature; and mixing, via an air mixer, the airstreams at the second temperature with surrounding airstreams at a temperature lower than the second temperature to result in an overall lower temperature at at least one component downstream of the heat source and the air mixer, wherein the air mixer comprises a first diverter plate and a second diverter plate arranged at an angle relative to one another.

17. The method according to claim 16, the method further comprising flowing air through a plurality of flow-through apertures in at least one of the first and second diverter plates.

18. A system comprising:

a chassis housing a plurality of hardware components;

an air intake configured to direct a plurality of airstreams at a first temperature into the chassis;

a heat source arranged in the chassis housing, the heat source arranged such that airstreams of the plurality of airstreams flowing proximal to the heat source get heated to a second temperature higher than the first temperature and airstreams of the plurality of airstreams distal to the heat source have temperatures between the first temperature and the second temperature;

at least one component downstream of the heat source; and an air mixer arranged between the heat source and the at least one component, the air mixer configured to facilitate mixing air streams at the second temperature with surrounding air streams at a temperature lower than the second temperature to result in an overall lower temperature at the at least one component, wherein the air mixer comprises a first diverter plate and a second diverter plate arranged at an angle relative to one another.

* * * * *